(12) United States Patent
Chang et al.

(10) Patent No.: US 9,659,806 B2
(45) Date of Patent: May 23, 2017

(54) SEMICONDUCTOR PACKAGE HAVING CONDUCTIVE PILLARS

(71) Applicant: Siliconware Precision Industries Co., Ltd., Taichung (TW)

(72) Inventors: Hong-Da Chang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/810,523

(22) Filed: Jul. 28, 2015

(65) Prior Publication Data
US 2016/0071784 A1   Mar. 10, 2016

(30) Foreign Application Priority Data
Sep. 10, 2014   (TW) .............................. 103131117 A

(51) Int. Cl.
| | | |
|---|---|---|
| *H01L 23/48* | (2006.01) | |
| *H01L 23/528* | (2006.01) | |
| *H01L 21/683* | (2006.01) | |
| *H01L 23/522* | (2006.01) | |
| *H01L 21/56* | (2006.01) | |

(Continued)

(52) U.S. Cl.
CPC ........ *H01L 21/6835* (2013.01); *H01L 21/561* (2013.01); *H01L 23/5384* (2013.01);
(Continued)

(58) Field of Classification Search
CPC ..... H01L 21/568; H01L 24/19; H01L 21/561; H01L 23/3128; H01L 2224/131; H01L 2924/014; H01L 23/48; H01L 21/56; H01L 23/528; H01L 21/683; H01L 23/522; H01L 21/768; H01L 23/31; H01L 23/00; H01L 24/06; H01L 23/5226
(Continued)

(56) References Cited

U.S. PATENT DOCUMENTS

2009/0309212 A1* 12/2009 Shim ..................... H01L 21/568
257/700
2010/0330742 A1* 12/2010 Sugiyama ......... H01L 23/49833
438/107

(Continued)

*Primary Examiner* — Alexander Oscar Williams
(74) *Attorney, Agent, or Firm* — Mintz Levin Cohn Ferris Glovsky and Popeo, P.C.; Peter F. Corless; Steven M. Jensen

(57) ABSTRACT

A semiconductor package and a method for fabricating the semiconductor package are provided. The semiconductor package includes a base layer, a plurality of conductive pillars, a semiconductor element, and an encapsulation. The base layer has opposing first and second surfaces and a receiving part. The conductive pillars are formed on the second surface. Each of the conductive pillars has first and second terminals, and the second terminal is distant from the second surface of the base layer. The semiconductor element is received in the receiving part, and has opposing active and passive surfaces, and the active surface is exposed from the first surface. The encapsulation is formed on the second surface, encapsulates the conductive pillars and the semiconductor element, and has opposing third and fourth surfaces, and the second terminals of the conductive pillars are exposed from the fourth surface. The semiconductor package is provided with the conductive pillars having fine pitches.

20 Claims, 12 Drawing Sheets

(51) Int. Cl.
  *H01L 21/768* (2006.01)
  *H01L 23/31* (2006.01)
  *H01L 23/00* (2006.01)
  *H01L 23/538* (2006.01)
  *H01L 23/498* (2006.01)
(52) U.S. Cl.
  CPC .......... *H01L 23/5389* (2013.01); *H01L 24/19* (2013.01); *H01L 24/96* (2013.01); *H01L 24/97* (2013.01); *H01L 23/3128* (2013.01); *H01L 23/49816* (2013.01); *H01L 2221/68318* (2013.01); *H01L 2221/68359* (2013.01); *H01L 2221/68368* (2013.01); *H01L 2221/68372* (2013.01); *H01L 2224/04105* (2013.01); *H01L 2224/12105* (2013.01); *H01L 2224/16227* (2013.01)
(58) Field of Classification Search
  USPC ....... 257/774, 773, 701, 700, 758, 786, 784, 257/E23.01, E21.502; 438/127
  See application file for complete search history.

(56) References Cited

U.S. PATENT DOCUMENTS

| | | | | |
|---|---|---|---|---|
| 2012/0061825 A1* | 3/2012 | Chang | .................. | H01L 21/561 257/737 |
| 2013/0147041 A1* | 6/2013 | Chan | ....................... | H01L 21/48 257/738 |
| 2013/0200528 A1* | 8/2013 | Lin | .......................... | H01L 24/97 257/774 |
| 2014/0021629 A1* | 1/2014 | Chang | ................... | H01L 21/568 257/774 |
| 2015/0179616 A1* | 6/2015 | Lin | .......................... | H01L 25/50 257/773 |
| 2015/0221573 A1* | 8/2015 | Paek | ...................... | H01L 21/568 257/738 |
| 2015/0270237 A1* | 9/2015 | Chi | ........................ | H01L 23/528 257/737 |
| 2015/0382469 A1* | 12/2015 | Hu | ..................... | H01L 23/49827 361/761 |
| 2016/0043047 A1* | 2/2016 | Shim | ...................... | H01L 21/561 257/773 |
| 2016/0049376 A1* | 2/2016 | Chen | ....................... | H01L 24/03 438/106 |
| 2016/0119333 A1* | 4/2016 | Gill | ..................... | H04L 63/0853 726/7 |
| 2016/0141227 A1* | 5/2016 | Lin | ....................... | H01L 23/481 257/774 |
| 2016/0148873 A1* | 5/2016 | Chiang | ............... | H01L 23/5384 257/774 |
| 2016/0190099 A1* | 6/2016 | Liu | ..................... | H01L 21/6835 257/774 |

* cited by examiner

SEMICONDUCTOR PACKAGE HAVING CONDUCTIVE PILLARS

CROSS-REFERENCES TO RELATED APPLICATIONS

This application claims under 35 U.S.C. §119(a) the benefit of Taiwanese Application No. 103131117, filed Sep. 10, 2014, the entire contents of which are incorporated herein by reference.

BACKGROUND OF THE INVENTION

1. Field of the Invention

The present invention relates to semiconductor packages and methods for fabricating the same, and, more particularly, to a semiconductor package having conductive pillars and a method of fabricating the same.

2. Description of Related Art

In the current semiconductor package, a plurality of conductive balls (such as solder balls or bumps) are commonly used as conductive elements for forming electrical connection, an encapsulant is used to encapsulate the chip and the conductive balls, and the two terminals of each of the conductive balls are exposed from the upper and lower surfaces of the encapsulant, respectively, and a build-up structure is disposed on the encapsulant and electrically connected to the chip via the conductive balls.

FIGS. 1A-1G are cross-sectional views showing a semiconductor package 1 and a method of fabricating the same.

As shown in FIG. 1A, a first carrier 10 having a first release layer 101 is provided. A chip 11 and a plurality of conductive balls 12 are disposed on the first release layer 101. The chip 11 has a plurality of solder pads 111 and opposing active and passive surfaces 11a and 11b. Each of the conductive balls 12 has a width W1, and opposing first and second terminals 12a and 12b.

As shown in FIG. 1B, an encapsulant 13 having first and second surfaces 13a and 13b is formed on the first release layer 101, and encapsulates the chip 11 and the conductive balls 12. A portion of each of the conductive balls 12 is removed, and a length L1 of each of the conductive balls 12 is exposed from the second terminals 12b.

As shown in FIG. 1C, a second carrier 14 is formed on the second surface 13b of the encapsulant 13 of the FIG. 1B, followed by reversing the whole package of FIG. 1B, and then removing the first carrier 10 via the first release layer 101 thereof.

As shown in FIG. 1D, a build-up structure 15 is formed on the active surface 11a of the chip 11 and the first surface 13a of the encapsulant 13. The build-up structure 15 has at least one dielectric layer 151, a plurality of conductive vias 152 formed in the dielectric layer 151, and at least one wiring layer 153 formed on the dielectric layer 151. The wiring layer 153 has a plurality of conductive pads 154.

As shown in FIG. 1E, an insulative protection layer 16 is formed on the build-up structure 15, and a plurality of under bump metallurgies (UBM) 161 are formed on the insulative protection layer 16 and electrically connected with the conductive pads 154.

As shown in FIG. 1F, a third carrier 17 having a second release layer 171 is disposed on the insulative protection layer 16.

As shown in FIG. 1E the whole package of FIG. 1F is inverted, and the second carrier 14, and the third carrier 17 are removed, followed by forming a plurality of solder balls 18 on the under bump metallurgy 161, so as to form the semiconductor package 1.

The drawback of the prior art is that the conductive balls 12 have a large width W1, and cannot be used in the semiconductor package 1 having fine pitches. Besides, a third carrier 17 is required in the method of fabricating the semiconductor package 1, which undesirably results in an increase in cost of the semiconductor package 1. Moreover, the chip 11 may easily suffer from impact or forces exerted from the encapsulant 13 and thus result in a displacement. Thus, there is a critical need for solving the aforementioned drawbacks.

SUMMARY OF THE INVENTION

The present invention provides a semiconductor package, comprising: a base layer having opposing first and second surfaces, and a receiving part penetrating the first and second surfaces; a plurality of conductive pillars formed on the second surface of the base layer, each of the conductive pillars having opposing first and second terminals, with the second terminal being distant from the second surface of the base layer; a semiconductor element received in the receiving part of the base layer and having an active surface being exposed from the first surface of the base layer and a passive surface opposing the active surface; and an encapsulant formed on the second surface of the base layer, encapsulating the conductive pillars and the semiconductor element, and having opposing third and fourth surfaces, wherein the second terminals of the conductive pillars are exposed from the fourth surface of the encapsulant.

The base layer may be a dielectric layer, an insulation layer, an interposer, a substrate or another encapsulant. The conductive pillars may be in the shape of a cylinder, elliptical cylinder, square cylinder, polygon column or spherical cylinder shape, and made of gold, silver, copper, tin and the alloys thereof.

In an embodiment, the semiconductor package further includes a seed layer formed between the first terminals of the conductive pillars or between the base layers of the conductive pillars.

The present invention further comprises a method of fabricating a semiconductor package, comprising: providing a base layer having opposing first and second surfaces, and a receiving part penetrating the first and second surfaces; forming on the second surface of the base layer a plurality of conductive pillars having opposing first and second terminals, with the second terminals being distant from the second surface of the base layer; disposing in the receiving part of the base layer a semiconductor element having an active surface exposed from the first surface of the base layer and a passive surface opposing the active surface; and forming on the second surface of the base layer an encapsulant having opposing third and fourth surfaces and encapsulating the conductive pillars and the semiconductor element, wherein the second terminals of the conductive pillars are exposed from the fourth surface of the encapsulant.

Before the conductive pillars are formed, the method may include the following steps of: forming the base layer having the receiving part on a first carrier; forming a resist layer having a plurality of through holes on the second surface of the base layer, and on a portion of the first carrier corresponding in position to the receiving part; filling the through holes with a conductive material to form the conductive pillars on the second surface of the base layer; and removing the resist layer to expose the conductive pillars.

In an embodiment, the method further comprises forming a seed layer on the second surface of the base layer, a wall surface of the receiving part, and a first release layer of the first carrier.

In an embodiment, the method further comprises, prior to forming the conductive pillars, the following steps of: forming the base layer having the receiving part and a plurality of vias on a first carrier; forming a resist layer having a plurality of through holes on the second surface of the base layer and a position of the first carrier corresponding in position to the receiving part, wherein the vias corresponds to the through holes; filling the vias and the through holes with a conductive material to form the conductive pillars on the first carrier, wherein a portion of each of the conductive pillars is embedded in a corresponding one of the vias of the base layer; and removing another portion of each of the conductive pillars that is not received inside the vias in the base layer.

In an embodiment, the method further comprises: forming a seed layer on the second surface of the base layer, a wall surface of the receiving part, a wall surface of the vias and a portion of a surface of the first release layer of the first carrier.

In an embodiment, the method further comprises: thinning the encapsulant from the fourth surface to expose the second terminals of the conductive pillars.

In an embodiment, the method further comprises: forming on the fourth surface of the encapsulant a first wiring layer electrically connected to the second terminals of the conductive pillars, wherein the first wiring layer has a plurality of first conductive pads.

In an embodiment the method further comprises: forming on the fourth surface of the encapsulant a first insulative protection layer that encapsulates the first wiring layer and has a plurality of first openings, from which the first conductive pads are exposed.

In an embodiment the method further comprises: forming on the first insulative protection layer a second carrier having a second release layer encapsulating the first insulative protection layer and the first conductive pads that are exposed from the first openings.

In an embodiment, the method further comprises: forming on the first insulative protection layer a semiconductor device that is electrically connected through a plurality of conductive elements to the first conductive pads that are exposed from the first openings.

In an embodiment, the method further comprises: forming in the base layer a plurality of vias, from which the first terminals of the conductive pillars are exposed.

In an embodiment, the method further comprises: forming a build-up structure on the first surface of the base layer and the active surface of the semiconductor element, and electrically connecting the build-up structure to the first terminals of the conductive pillars and solder pads of the semiconductor element, wherein the build-up structure has at least one dielectric layer, a plurality of conductive vias, and at least one second wiring layer that has a plurality of second conductive pads.

In an embodiment, the dielectric layer is formed on the first surface of the base layer and the active surface of the semiconductor element, the inner sides of the conductive vias are connected with the corresponding first terminals of the conductive pillars, and the second wiring layer is electrically connected with the conductive vias.

In an embodiment, the method comprises: forming on the outer side of the dielectric layer and the second wiring layer a second insulative protection layer that has a plurality of second openings, from which the outermost layer of the second conductive pads is exposed.

In an embodiment, the method comprises: forming a plurality of under bump metallurgies on the second conductive pads that are exposed from the second openings; and disposing a plurality of solder balls on the under bump metallurgies.

In an embodiment, the base layer has a plurality of vias penetrating the first surface and the second surface, allowing a portion of the conductive pillars to be embedded in the corresponding vias of the base layer, and the first terminals of the conductive pillars are exposed from the first surface of the base layer.

In an embodiment, the method further comprises: forming an adhesive layer in a gap formed between the semiconductor element and the base layer.

In summary, the semiconductor package and the method of fabricating the same according to the present invention are characterized by providing a base layer having a receiving part, wherein a plurality of conductive pillars are formed on the base layer, or a portion of the conductive pillars is embedded in the vias of the base layer, the semiconductor element is received in the receiving part of the base layer, and an encapsulant is then formed and encapsulates the conductive pillars and the semiconductor element.

Accordingly, the present invention is suitable to be used in a semiconductor package having fine pitches conductive pillars. Moreover, the semiconductor package fabricated according to the present invention has the advantage of reduced cost, as the semiconductor package does not require a third carrier in the fabricating process.

Besides, the length of the conductive pillars being embedded in the encapsulant is relative short, thereby eliminating the occurrence of conductive pillars being damaged due to impact, pressing force exerted from the encapsulant.

In addition, the semiconductor element may be directly embedded in the receiving part of the base layer, which is then secured in position by the adhesive layer, to prevent displacement of the semiconductor element resulted from being pressed by the encapsulant.

DETAILED DESCRIPTION OF THE PREFERRED EMBODIMENTS

The present invention is described in the following with specific embodiments, so that one skilled in the pertinent art may easily understand other advantages and effects of the present invention from the disclosure of the present invention.

It should be noted that all the drawings are not intended to limit the present invention. Various modification and variations may be made without departing from the spirit of the present invention. Further, terms, such as "upper", "one", "first", "second", "surface" and "active surface" "passive surface", "terminal" etc., are merely for illustrative purpose and should not be construed to limit the scope of the present invention.

Figure 2A:
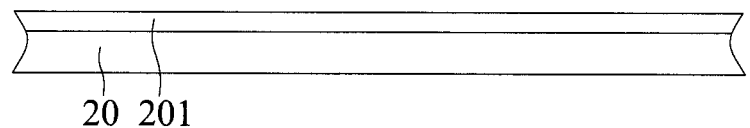
FIGS. 2A-2R are cross sectional view showing a semiconductor package and a fabricating method thereof in accordance with a first embodiment of the present invention.
Figure 2B:
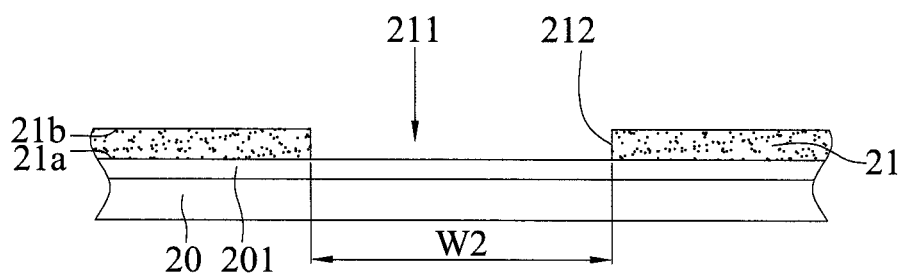
Figure 2C:
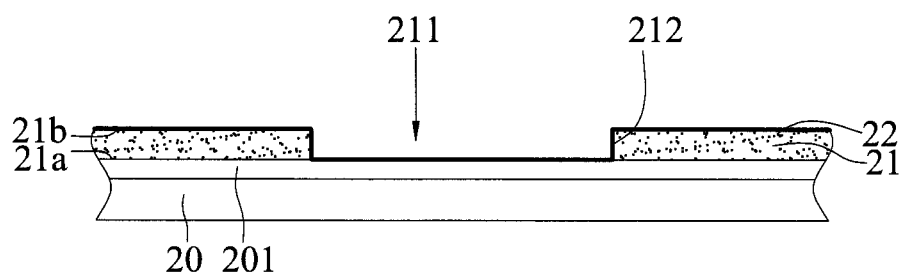
Figure 2D:
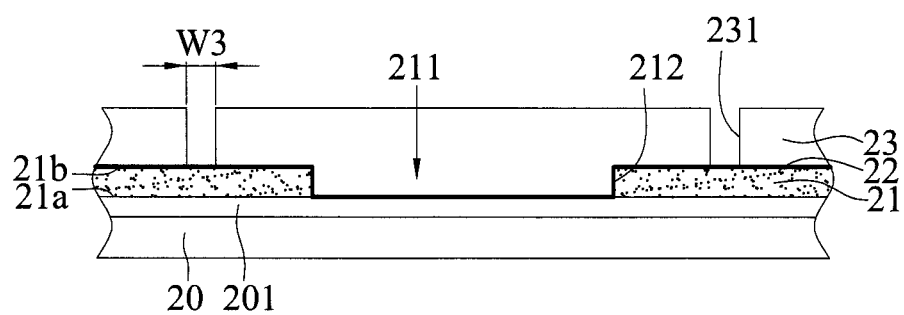
Figure 2E:
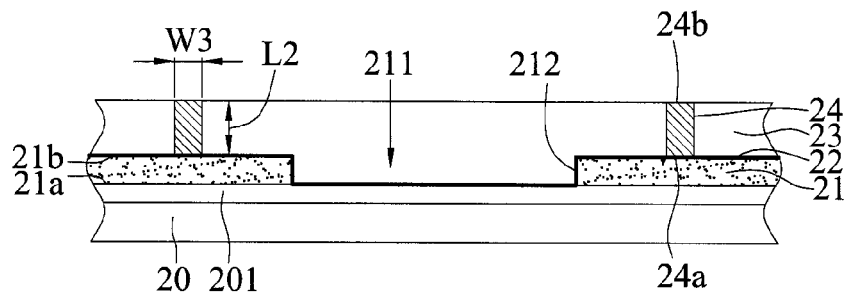
Figure 2F:
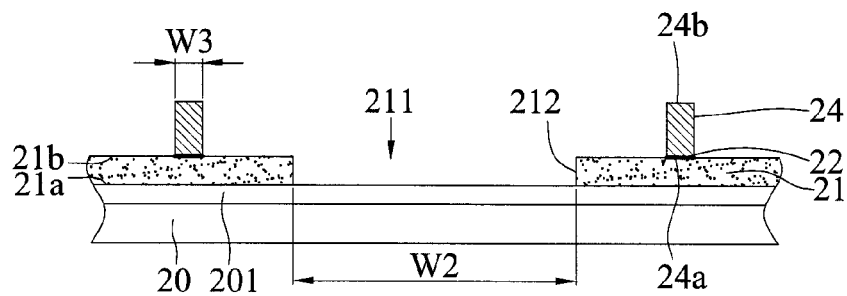
Figure 2G:
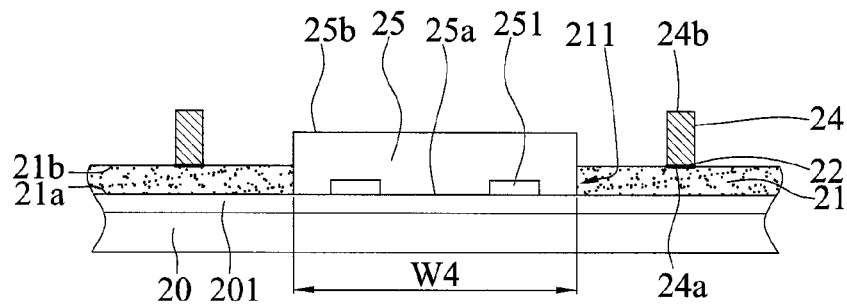
Figure 2H:
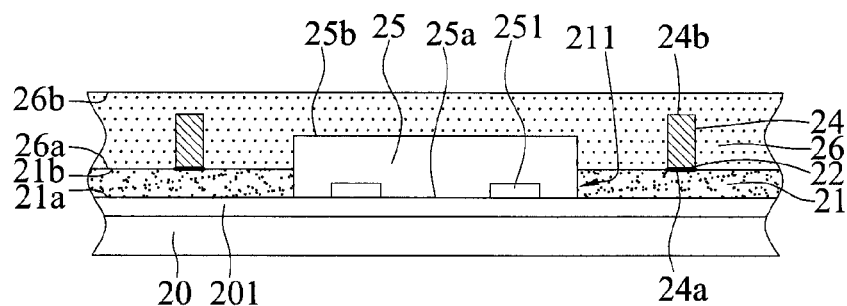
Figure 2I:
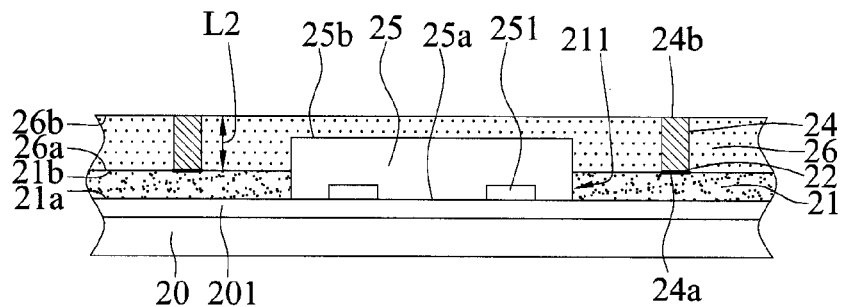
Figure 2J:
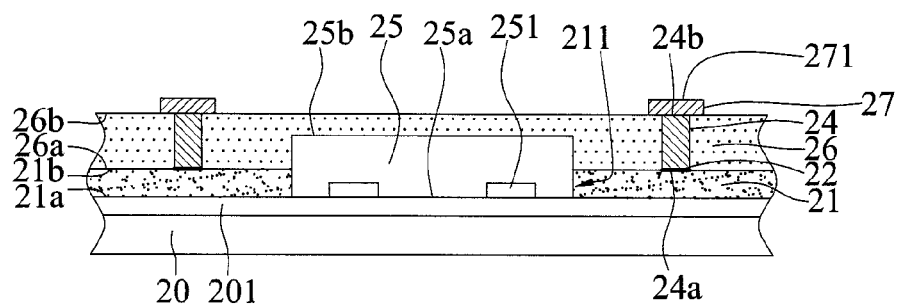
Figure 2K:
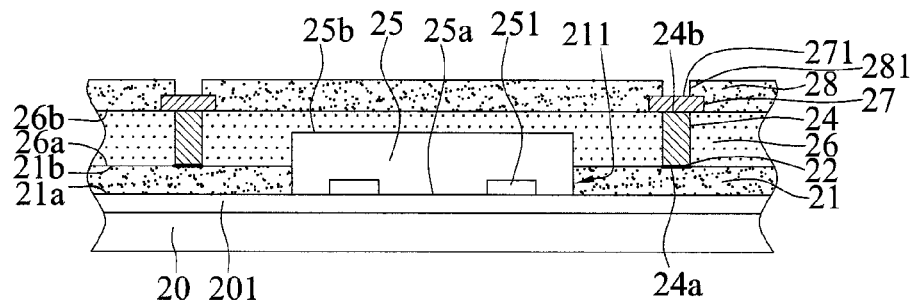
Figure 2L:
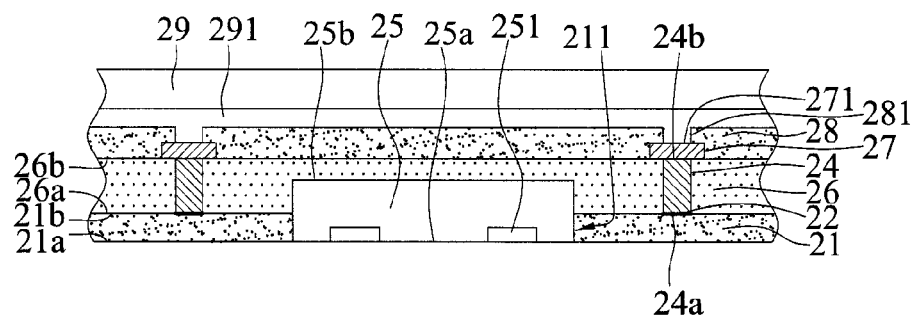
Figure 2M:
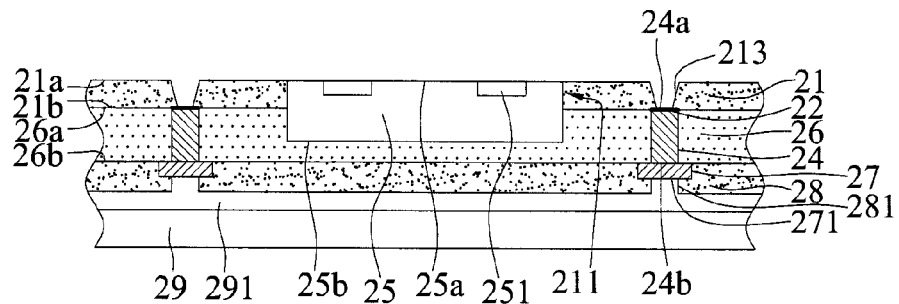
Figure 2N:
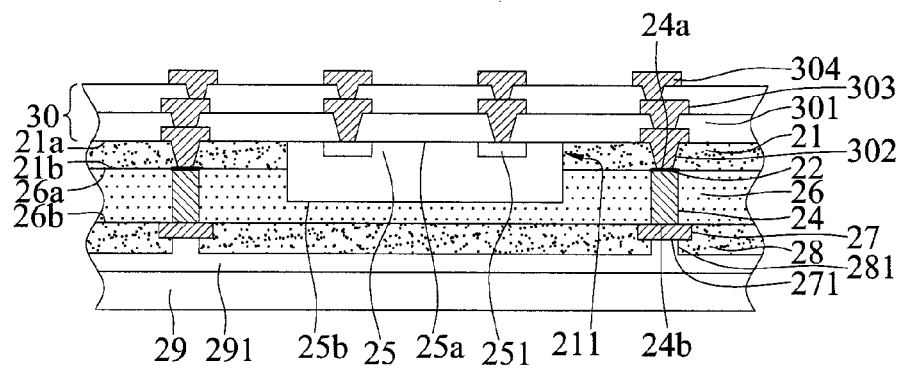
Figure 2O:
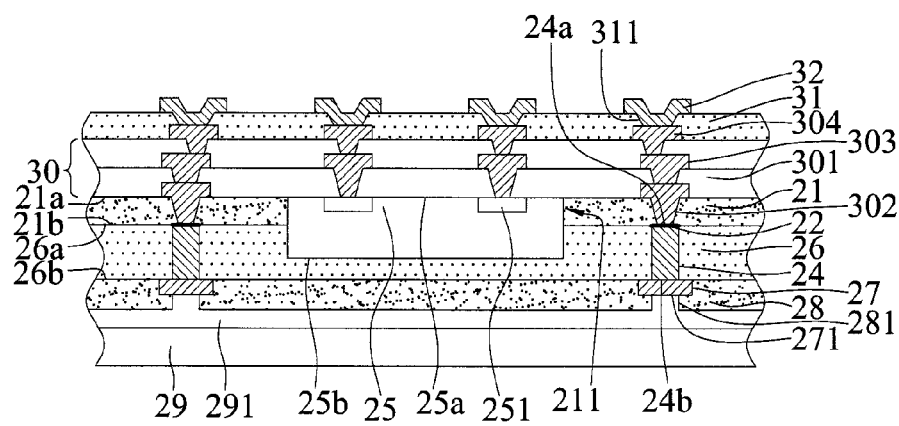
Figure 2P:
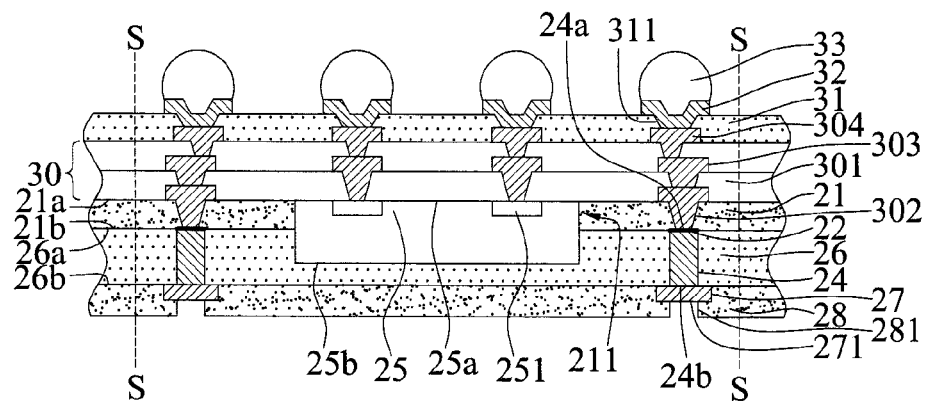
Figure 2Q:
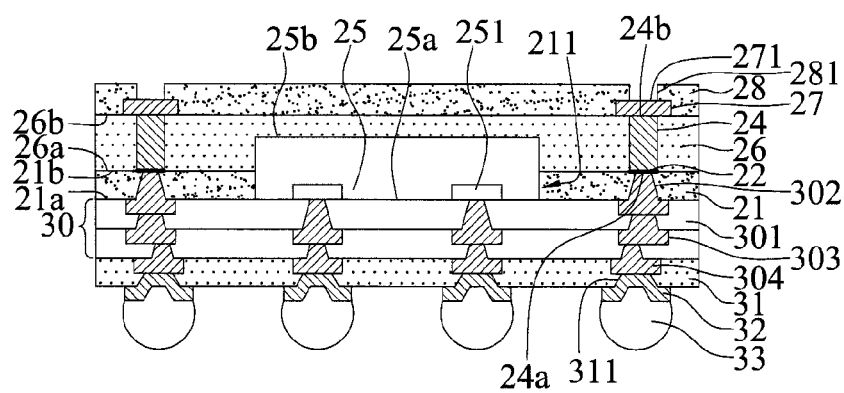
Figure 2R:
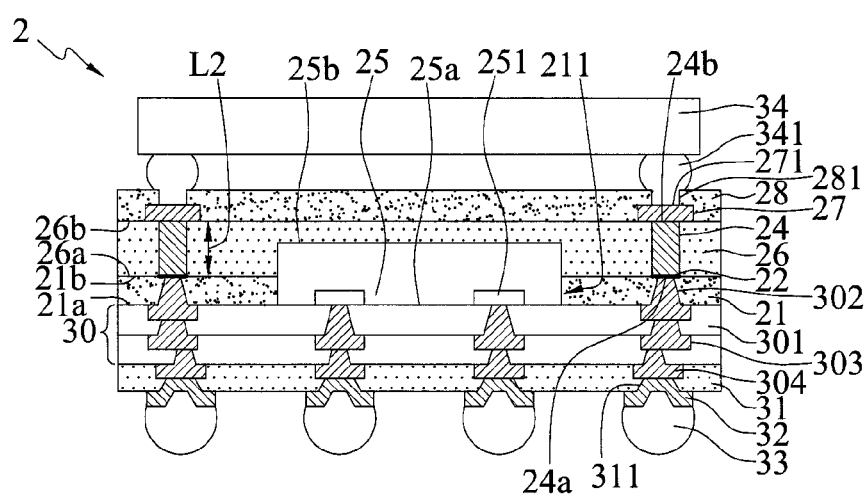

FIGS. 2A-2R are cross sectional views showing a semiconductor package and a method of fabricating the same in accordance with a first embodiment of the present invention.

As shown in FIG. 2A, a first carrier 20 having a first release layer 201 is provided. The first release layer 201 may be a release film, an adhesive tape, or an adhesive layer.

As shown in FIG. 2B, a base layer 21 is formed on the first release layer 201. In another embodiment, the first carrier 20 does not have the first release layer 201, and the base layer 21 is directly formed on the first carrier 20.

The base layer 21 has opposing first and second surfaces 21a and 21b, a receiving part 211 (such as an opening) is formed penetrating the first surface 21a and second surface 21b, and the first surface 21a faces the first release layer 201. The receiving part 211 has a width W2 and is exposed from a wall 212 of the base layer 21 and a portion of the first release layer 201.

The base layer 21 may be a dielectric layer, an insulative layer, an interposer, a substrate or an encapsulant, and the dielectric layer may be made of, but not limited to, Polyimide (PI), Benezocy-clobutene (BCB) or Polybenzoxazole (PBO).

As shown in FIG. 2C, a seed layer 22 is formed on the second surface 21b of the base layer 21, a wall surface 212 of the receiving part 211, and the first release layer 201 using sputtering or other similar methods. The seed layer 22 may be a conductive layer or a sputtering material layer.

As shown in FIG. 2D, a resist layer 23 is formed on the second surface 21b of the base layer 21 and first release layer 201 of the receiving part 211. A plurality of through holes 231 having a width W3 are formed in the resist layer 23 by laser drilling or etching techniques, and a portion of the seed layer 22 on the second surface 21b is exposed from the through holes 231.

As shown in FIG. 2E, the through holes 231 are filled with a conductive material, to form on the seed layer 22 on the second surface 21b of the base layer 21 a plurality of conductive pillars 24 having a length L2, a width W3, and opposing first and second terminals 24a and 24b, wherein the second terminals 24b are distant from the second surface 21b of the base layer 21.

Figure 1A:
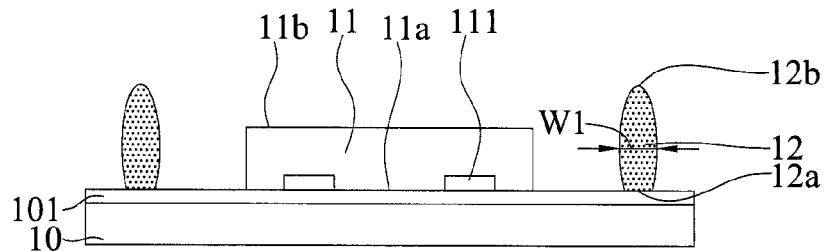
FIGS. 1A-1G are cross sectional view showing a conventional semiconductor package and the fabricating method thereof.
Figure 1B:
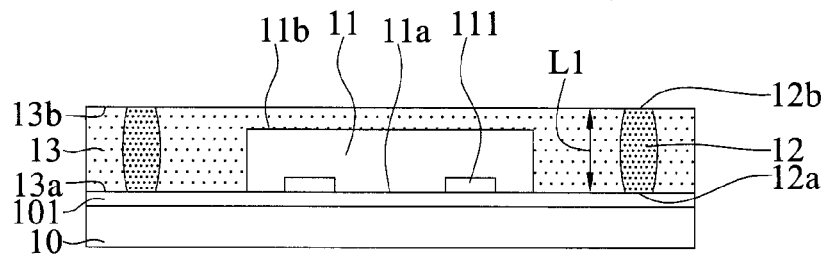
Figure 1C:
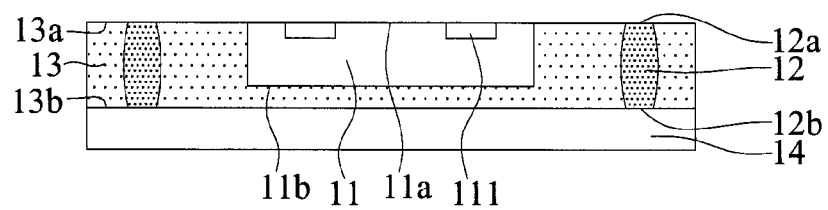
Figure 1D:
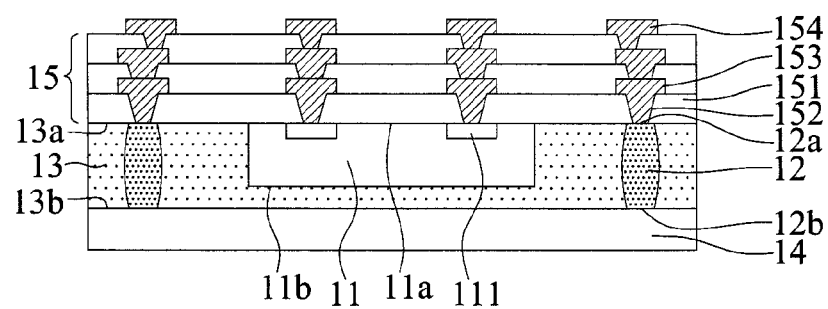
Figure 1E:
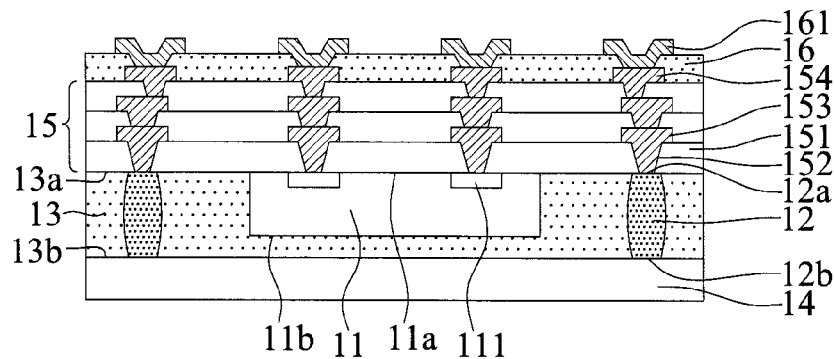
Figure 1F:
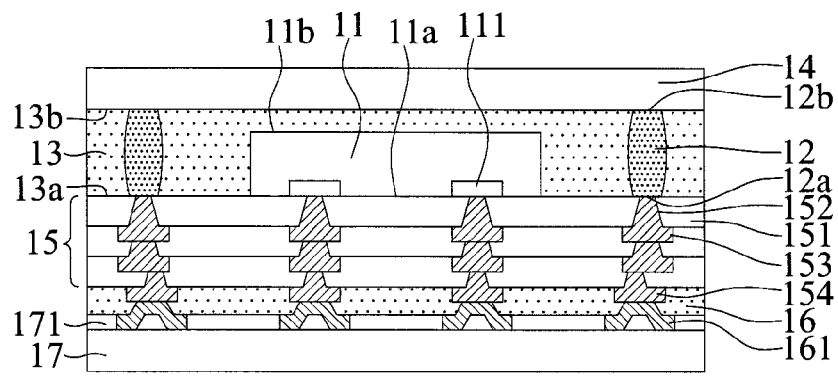

The length L2 of the conductive pillars 24 may be less than, but is not limited to, the length L1 of the conventional conductive balls 12 of FIG. 1B. The conductive pillars 24 may be in the shape of a cylinder, an elliptical cylinder, a square cylinder, a polygon column or a spherical cylinder, and the conductive pillars 24 may be made of gold, silver, copper, tin, nickel and the alloy thereof, etc.

As shown in FIG. 2F, the resist layer 23 of FIG. 2E is removed to expose the conductive pillars 24. Subsequently, the seed layer 22 outside the first terminals 24a of the conductive pillars 24 is removed, to expose a portion of the second surface 21b of the base layer 21, the wall surface 212 of the receiving part 211 and the first release layer 201 of the receiving part 211, allowing the seed layer 22 to be formed only between the first terminals 24a of the conductive pillars 24 and the second surface 21b of the base layer 21.

As shown in FIG. 2E the semiconductor element 25 (such as a chip) having a plurality of solder pads 251 and opposing active and passive surfaces 25a and 25b is received in the receiving part 211 and mounted on the first release layer 201, with the solder pads 251 and the active surface 25a being exposed from the first surface 21a of the base layer 21. The width W4 of the semiconductor element 25 equals to or is close to the width W2 of the receiving part 211, such that a gap between the semiconductor element 25 and the base layer 2 shown in FIG. 3G does not exist. However, the present invention is not limited thereto.

As shown in FIG. 2H, an encapsulant 26 having opposing third and fourth surfaces 26a and 26b is formed on the second surface 21b of the base layer 2, and encapsulates the conductive pillars 24 and the semiconductor element 25.

As shown in FIG. 2I, a grinding or other methods are applied, to thin the encapsulant 26 from its fourth surface 26b to expose the second terminals 24b of the conductive pillars 24.

As shown in FIG. 2J, a first wiring layer 27 having a plurality of first conductive pads 271 is formed on the fourth surface 26b of the encapsulant 26 and electrically connected to the second terminals 24b of the conductive pillars 24.

As shown in FIG. 2K, a first insulative protection layer 28 is formed on the fourth surface 26b of the encapsulant 26 and encapsulates the first wiring layer 27. The first insulative protection layer 28 has a plurality of first openings 281, and the first conductive pads 271 are exposed from the first openings 281. The first insulative protection layer 28 may be a solder mask layer or an insulative protection layer.

As shown in FIG. 2L, a second carrier 29 having a second release layer 291 is formed on the first insulative protection layer 28, and the second release layer 291 encapsulates the first insulative protection layer 28 and the first conductive pads 271 that are exposed from the first openings 281. The second release layer 291 may be a release film, an adhesive tape, or an adhesive layer.

After removing the first release layer 201 of FIG. 2K, the first carrier 20 is removed, to expose the first surface 21a of the base layer 21, the active surface 25a of the semiconductor element 25, and the solder pads 251.

As shown in FIG. 2M, the entire structure of FIG. 2L is reversed upside down, and a plurality of vias 213 are formed in the base layer 21, to expose the first terminals 24a of the conductive pillars 24 and the seed layer 22 thereon through the vias 213.

As shown in FIG. 2N, a build-up structure 30 is disposed on the first surface 21b of the base layer 21 and the active surface 25a of the semiconductor element 25, and is electrically connected with the seed layer 22 of the first terminals 24a of the conductive pillars 24 and the solder pads 251 of the semiconductor element 25.

The build-up structure 30 has at least one (such as two) dielectric layer 301, a plurality of (such as three) conductive vias 302 and at least one (such as three) second wiring layer 303, and the second wiring layer 303 has a plurality of second conductive pads 304.

In an embodiment, the innermost layer of the dielectric layer 301 is formed on the first surface 21a of the base layer 21 and the active surface 25a of the semiconductor element 25, the innermost conductive vias 302 are electrically connected with the seed layer 22 of the first terminals 24a of the conductive pillars 24, and the second wiring layer 303 is electrically connected with the conductive vias 302.

As shown in FIG. 2O, a second insulative protection layer 31 is formed on the outermost layer of the dielectric layer 301 and the second wiring layer 303, and the second insulative protection layer 31 has a plurality of second openings 311 to expose the outermost layer of the second conductive pads 304. A plurality of under bump metallurgies 32 are formed on the second conductive pads 304, which are exposed from the second openings 311.

As shown in FIG. 2P, a plurality of solder balls 33 are disposed on the under bump metallurgies 32. The second release layer 291 of FIG. 2O is removed so as to remove the second carrier 29, for exposing the first insulative protection layer 28 and the first conductive pads 271 that are exposed from first openings 281.

As shown in FIG. 2Q, a singulation process is performed to the whole package according to a plurality of cutting lines S of FIG. 2P, and the package is then reversed to form a plurality of structures shown in FIG. 2Q.

As shown in FIG. 2R, a semiconductor device 34 (such as a chip) is disposed on the first insulative protection layer 28, and is electrically connected through the plurality of conductive elements 341 (such as solder balls or bonding wires) to the first conductive pads 271 that are exposed from the first openings 281, so as to complete the formation of a semiconductor package 2.

Figure 3A:
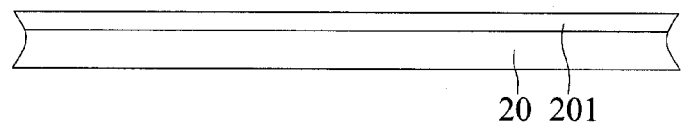
FIGS. 3A-3R are cross sectional view showing a semiconductor package and a fabricating method thereof in accordance with a second embodiment of the present invention, wherein FIG. 3G' is another embodiment of FIG. 3G.
Figure 3B:
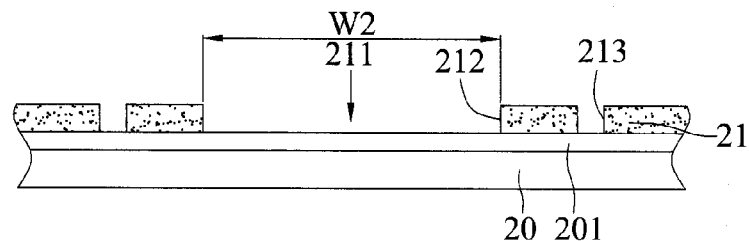
Figure 3C:
Figure 3D:
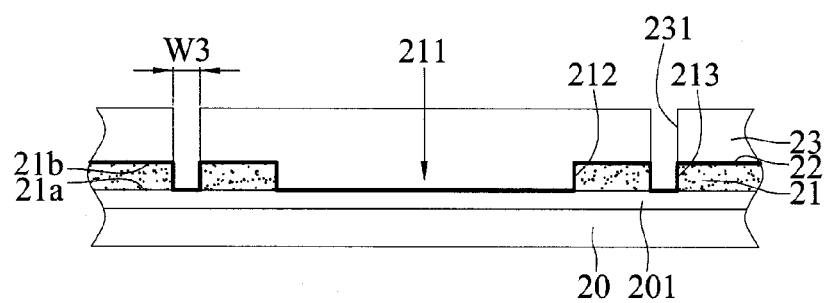
Figure 3E:
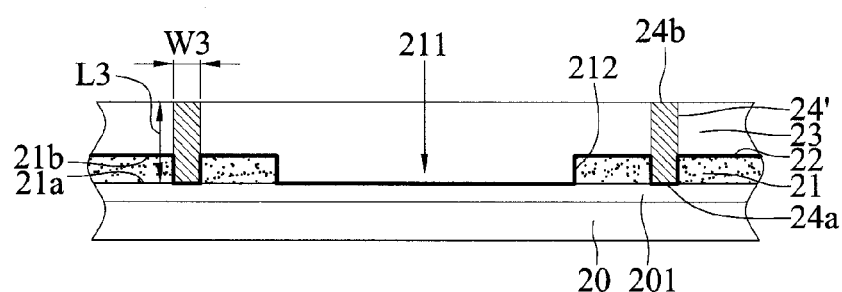
Figure 3F:
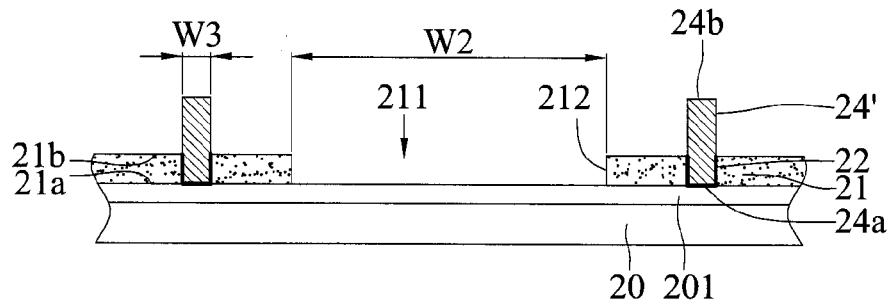
Figure 3G:
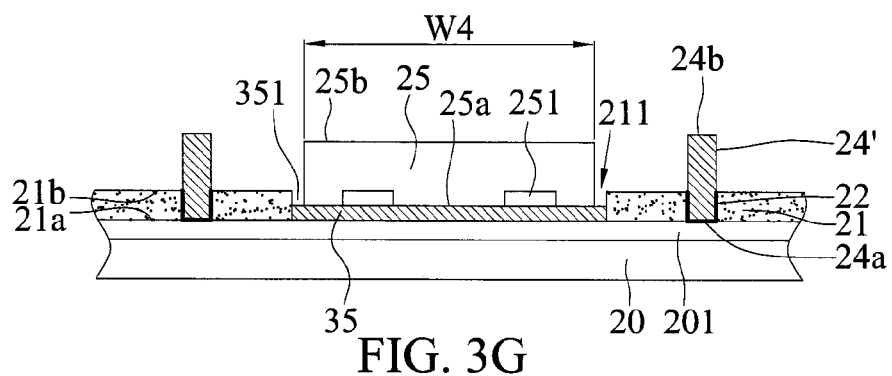
Figure 3G:
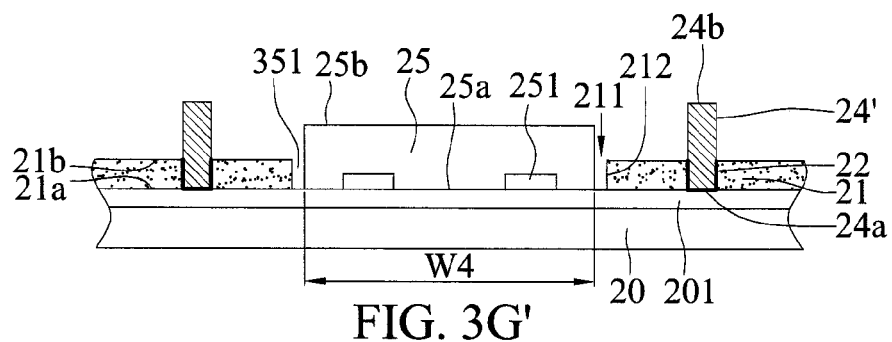
Figure 3H:
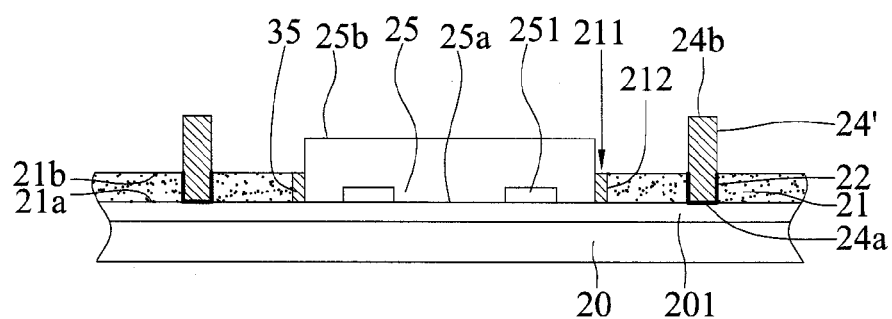
Figure 3I:
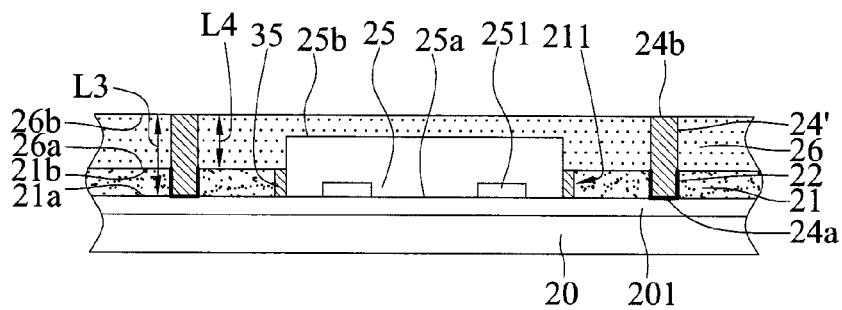
Figure 3J:
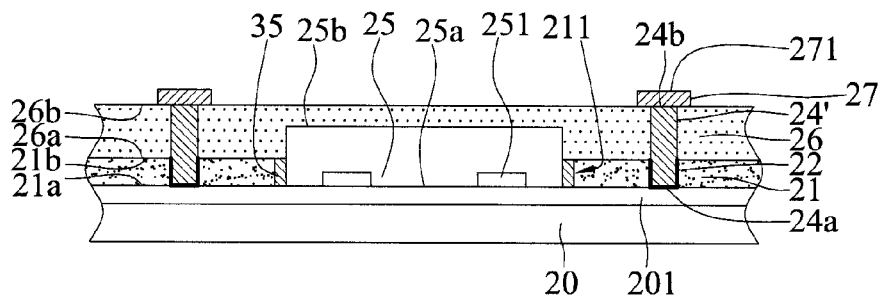
Figure 3K:
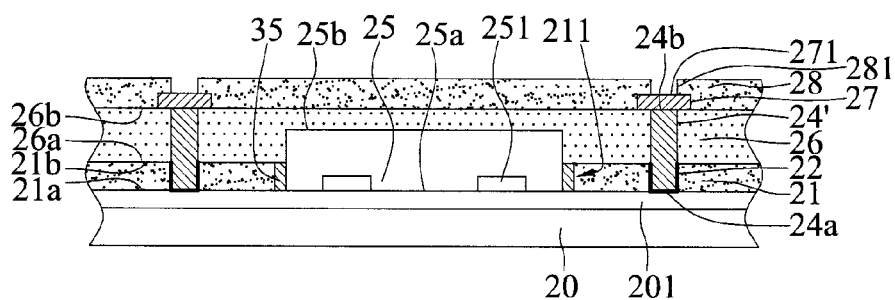
Figure 3L:
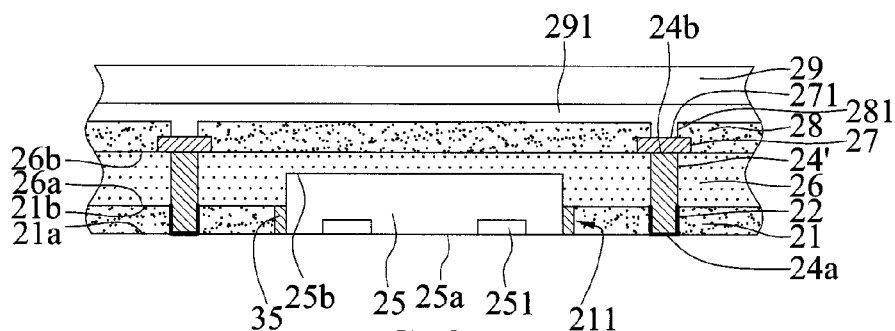
Figure 3M:
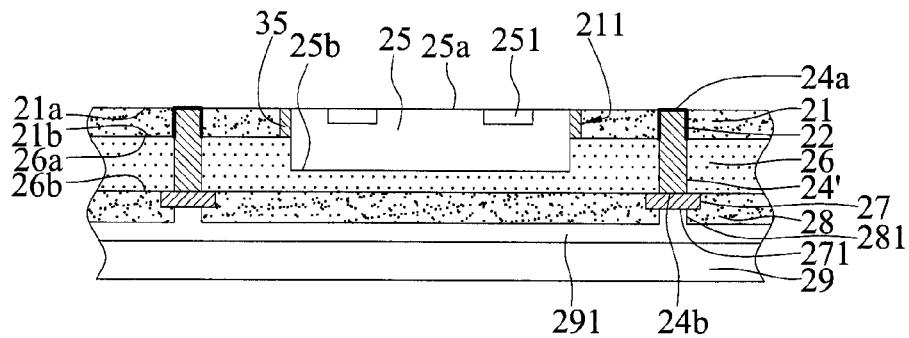
Figure 3N:
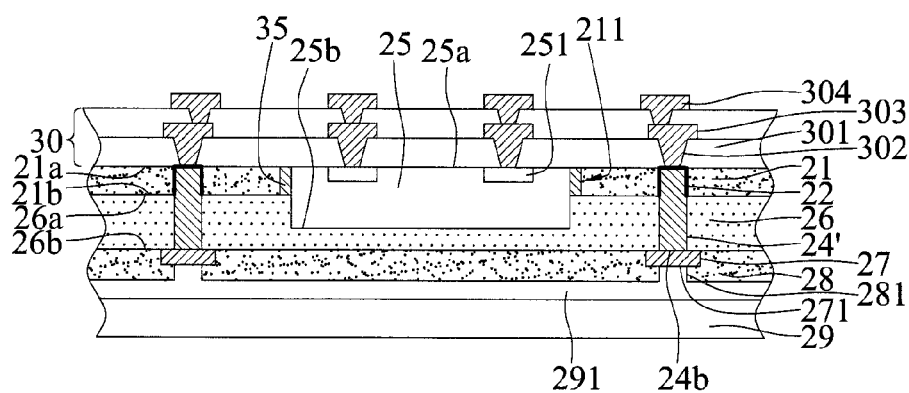
Figure 3O:
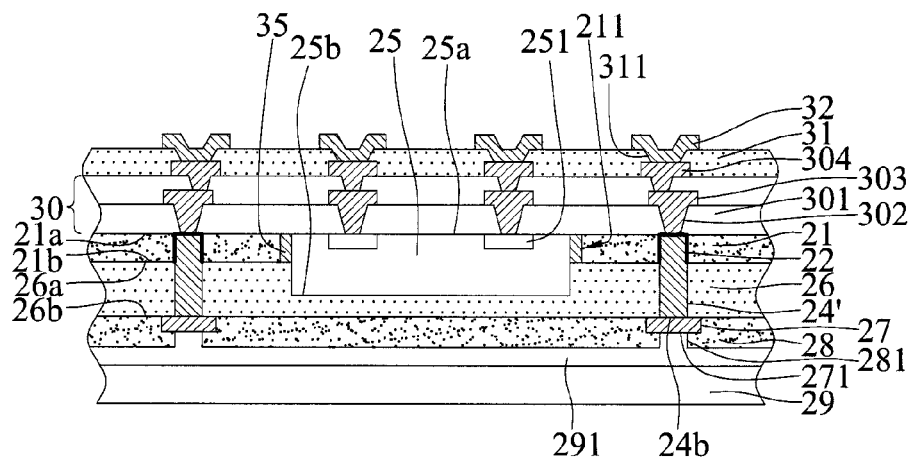
Figure 3P:
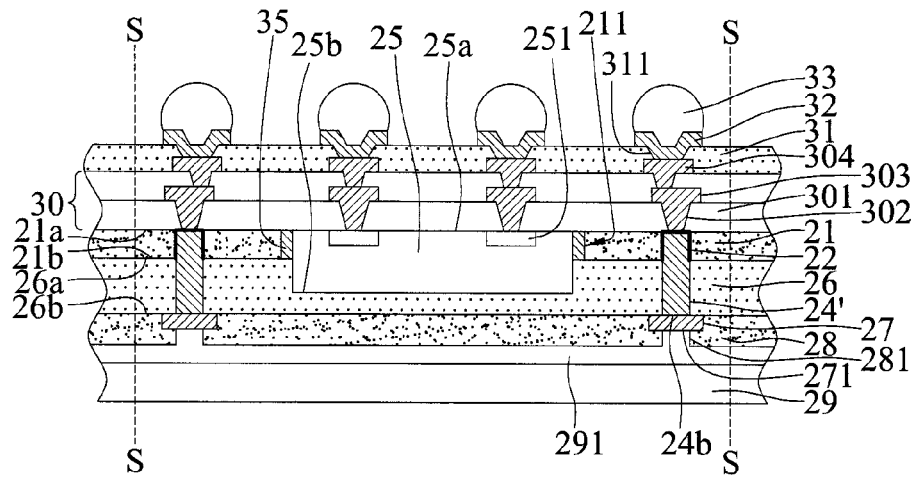
Figure 3Q:
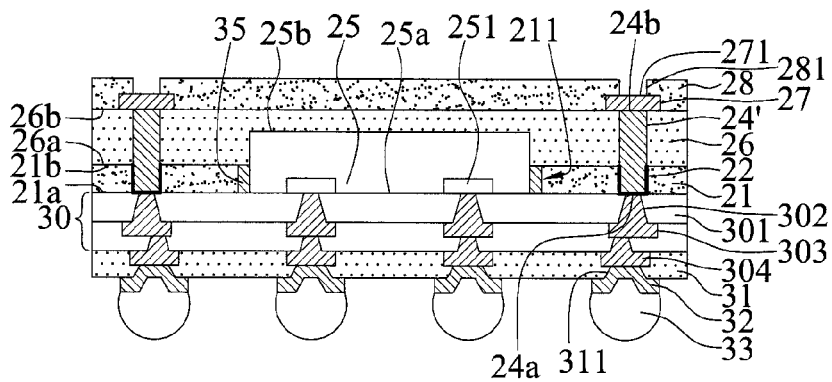
Figure 3R:
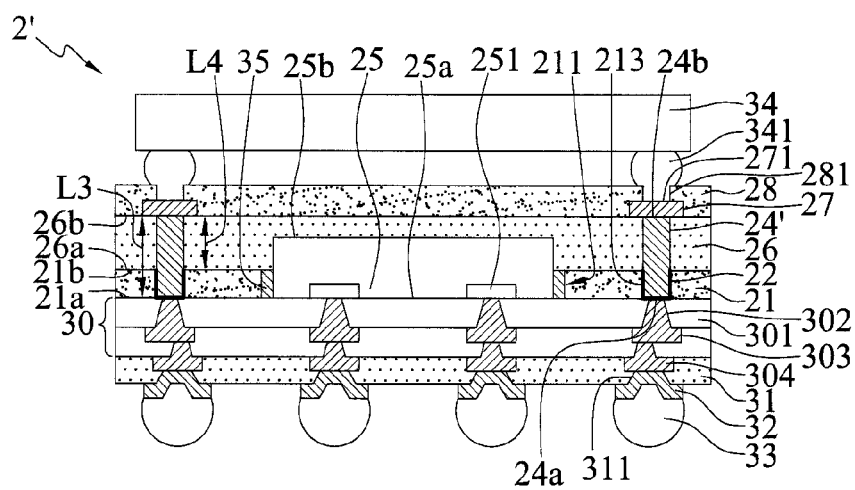

FIGS. 3A-3R are cross sectional views showing a semiconductor package and a method of fabricating the same in accordance with a second embodiment of the present invention, wherein FIG. 3G' is another embodiment of FIG. 3G.

The method of fabricating the semiconductor package 2 of FIGS. 3A-3R is substantially the same as the method of fabricating the semiconductor package 2' described in FIGS. 2A-2R, and the differences are as follows.

In FIG. 3B, a base layer 21 having a receiving part 211 and a plurality of vias 213 is formed on the first release layer 201 of the first carrier 20. The receiving part 211 and the vias 213 penetrate the first surface 21a and second surface 21b of the base layer 21. A portion of the first release layer 201 is exposed from the receiving part 211 and the vias 213. The receiving part 211 and the vias 213 may be formed by laser drilling or etching techniques.

In FIG. 3C, a seed layer 22 is formed on the second surface 21b of the base layer 21, the wall surface 212 of the receiving part 211, the wall surface of the vias 213, and a portion of the first release layer 201.

In FIG. 3D, a resist layer 23 having a plurality of through holes 231 is formed on the seed layer 22. The through holes 231 each have a width W3, and correspond to the vias 213. The through holes 231 may be formed by laser drilling or etching techniques.

In FIG. 3E, the vias 213 and through holes 231 of FIG. 3D are filled with a conductive material to form a plurality of conductive pillars 24' on the seed layer 22 of the first release layer 201, and a portion of the conductive pillars 24 (such as the lower portion) is embedded in the vias 212 of the base layer 21. The length L3 of the conductive pillars 24' equals to the length of the conventional conductive balls 12 of FIG. 1B, but the present invention is not limited thereto.

In FIG. 3F, the resist layer 23 is removed to expose the portion of the conductive pillars 24' that is not embedded in the vias 213 of the base layer 21 (the upper portion). Subsequently, the seed layer 22 outside the conductive pillars 24' is removed, to expose a portion of the second surface 21b of the base layer 21, a wall surface 212 of the receiving part 211, and the first release layer 201 of the receiving part 211, allowing the seed layer 22 to be formed between the first terminals 24a of the conductive pillars 24' and the first release layer 201, and between the wall surface of the base layer 21 and the conductive pillars 24'.

In FIG. 3G, an adhesive 35 is formed on the first release layer 201 of the receiving part 211, and the adhesive 35 may be in a form of liquid colloid or an adhesive material. The semiconductor element 25 is formed on the adhesive 35, and the width W4 of the semiconductor element 25 may be less than the width W2 of the receiving part 211, such that a gap 351 is formed between the semiconductor element 25 and the base layer 21. The gap 351 may be small for the purpose of adhering the adhesive 35 and securing the semiconductor element 24.

FIG. 3G' is another embodiment of the FIG. 3G. In FIG. 3G', the semiconductor element 25 is disposed on the first release layer 201 of the receiving part 211.

In FIG. 3H, the semiconductor element 25 may be pressed downwardly to make contact with the first release layer 201, allowing the active surface 25a of the semiconductor element 25 and solder pads 251 to be exposed from the first surface 21a of the base layer 21, and the adhesive layer 35 is translocated in the gap 351 between the semiconductor element 25 and the base layer 21. Subsequently, a curing process is performed on the adhesive layer 35, allowing the semiconductor element 25 to be attached to the wall surface 212 of the base layer 21 through the adhesive layer 35.

Alternatively, the gap may be directly filled with liquid colloid (or adhesive material), followed by a curing process to form the adhesive layer 35 as shown in FIG. 3H, allowing the semiconductor element 25 to be attached to the wall surface 212 of the base layer 21 via the adhesive layer 35.

In FIG. 3I, the fourth surface 26b of the encapsulant 26 is directly flush with the second terminals 24b of the conductive pillars 24', and the thinning process as described from the FIG. 2H to FIG. 2I is not required. Moreover, a portion of the conductive pillars 24' is embedded in the encapsulant 26, the length L4 of the portion of the conductive pillars 24' in the encapsulant 26 is less than the length L3 of the conductive pillars 24', and the length L3 of the conductive pillars 24' equals to the length L1 of the conventional conductive balls 12 of FIG. 1G, thereby eliminating or reducing the occurrence of damages to the conductive pillars 24' according to the present invention.

In FIG. 3M, the seed layer 22 of the first terminals 24a of the conductive pillars 24' may be directly exposed from the first surface 21a of the base layer 21, without the need of forming a plurality of vias 213 in the base layer 21, as shown in FIG. 2M.

In FIG. 3N, the dielectric layer 301 may be formed on the first surface 21a of the base layer 21, the active surface 25a of the semiconductor element 25, and the adhesive layer 35, and the innermost layer of the conductive vias 302 is formed in the dielectric layer 301 and electrically connected with the seed layer 22 of the first terminals 24a of the conductive pillars 24'. The second wiring layer 303 is formed on the dielectric layer 301 and electrically connected with the conductive vias 302.

The present invention further provides a semiconductor package 2, as shown in FIG. 2R. The semiconductor package 2 comprises a base layer 21, a plurality of conductive pillars 24, a semiconductor element 25, and an encapsulant 26.

The base layer 21 has opposing first and second surfaces 21a and 21b, and a receiving part 211 (such as an opening) penetrating the first surface 21a and second surface 21b. The base layer 21 may be a dielectric layer, an insulation layer, an interposer, a substrate or an encapsulant. The dielectric layer may be made of polyimide (PI), benzocyclobutene (BCB) or polybenzoxazole (PBO).

The conductive pillars 24 are disposed on the second surface 21b of the base layer 21. Each of the conductive pillars 24 has opposing first and second terminals 24a and 24b, and the second terminals 24b are far away from the second surface 21b of the base layer 21. The conductive pillars 24 has a length L2 (height) less than the length L1 (height) of the conventional conductive balls 12 of FIG. 1G, but the present invention is not limited thereto. The conductive pillars 24 may be in the shape of a cylinder, an elliptical cylinder, a square cylinder, a polygon column or a spherical cylinder, and the conductive pillars 24 made of made of gold, silver, copper, tin, nickel and the alloy thereof, etc.

The semiconductor element 25 having opposing active and passive surfaces 25a and 25b is received in the receiving part 211 of the base layer 2, with the active surface 25a being exposed from the first surface 21a of the base layer 21.

The encapsulant 26 having opposing third and fourth surfaces 26a and 26b is formed on the second surface 21b of the base layer 21 and encapsulates the conductive pillars 24 and the semiconductor element 25, with the second terminals 24b of the conductive pillars 24 being exposed from fourth surface 26b of the encapsulant 26.

The semiconductor package 2 further comprises a seed layer 22 formed on the first terminals 24a of the conductive pillars 24, and the seed layer 22 may be a conductive layer or a sputtering material. The base layer 21 has a plurality of vias 213, and the seed layer 22 of the first terminals 24a of the conductive pillars 24 are exposed from the vias 213.

The semiconductor package 2 may comprise a first wiring layer 27 formed on the fourth surface 26b of the encapsulant 26 and electrically connected with the second terminals 24b of the conductive pillars 24, and the first wiring layer 27 has a plurality of first conductive pads 271.

The semiconductor package 2 may comprise a first insulative protection layer 28 formed on the fourth surface 26b of the encapsulant and encapsulating the first wiring layer 27, and the first insulative protection layer 28 has a plurality of first openings 281 that expose the first conductive pads 271.

The semiconductor package 2 may comprise a semiconductor device 34 disposed on the first insulative protection layer 28 and electrically connected with the first conductive pads 271 that are exposed from the first openings 281 through a plurality of conductive elements 341 (such as solder balls or bonding wires).

The semiconductor package 2 may comprise a build-up structure 30 disposed on the first surface 21a of the base layer 21 and the active surface 25a of the semiconductor element 25, and electrically connected with the first terminals 24a of the conductive pillars 24 and the solder pads 251 of the semiconductor element 25. The build-up structure 30 may comprise one dielectric layer 301, a plurality of conductive vias 302, and at least one second wiring layer 303, and the second wiring layer 303 has a plurality of second conductive pads 304.

In an embodiment, the dielectric layer 301 is formed on the first surface 21a of the base layer 21 and the active surface 25a of the semiconductor element 25, and the innermost conductive vias 302 are formed in the vias 213 of the base layer 21, allowing the conductive vias 302 to be electrically connected with the seed layer 22 of the first terminals 24a of the conductive pillars 24. The innermost layer of the second wiring layer 303 is formed on the first surface 21a of the base layer 21 and electrically connected with the conductive vias 302.

The semiconductor package 2 may further comprise a second insulative protection layer 31 formed on the outermost layer of the dielectric layer 301 and on the second wiring layer 303. The second insulative protection layer 31 has a plurality of second openings 311 that expose the outermost layer of the second conductive pads 304.

The semiconductor package 2 may comprise a plurality of under bump metallurgies 32 and a plurality of solder balls 33. The under bump metallurgies 32 are formed on the second conductive pads 304 that are exposed from the second openings 311, and the solder balls 33 are disposed on the under bump metallurgies 32.

The present invention further provides a semiconductor package 2', as shown in FIG. 3R. The semiconductor package 2' of FIG. 3R is substantially the same as the semiconductor package 2 of FIG. 2R, except for the difference as follows.

In FIG. 3R, the base layer 21 has a plurality of vias 213 penetrating the first surface 21a and second surface 21b of the base layer 21. A portion of each of the conductive pillars 24' is embedded in the vias 213 of the base layer 21, the remaining portion of the conductive pillars 24' is embedded in the encapsulant 26, and the first terminals 24a of the conductive pillars 24' are exposed from the first surface 21a of the base layer 21. The seed layer 22 is formed on the first terminals 24a of the conductive pillars 24' and between the base layer 21 and the conductive pillars 24'.

Figure 1G:
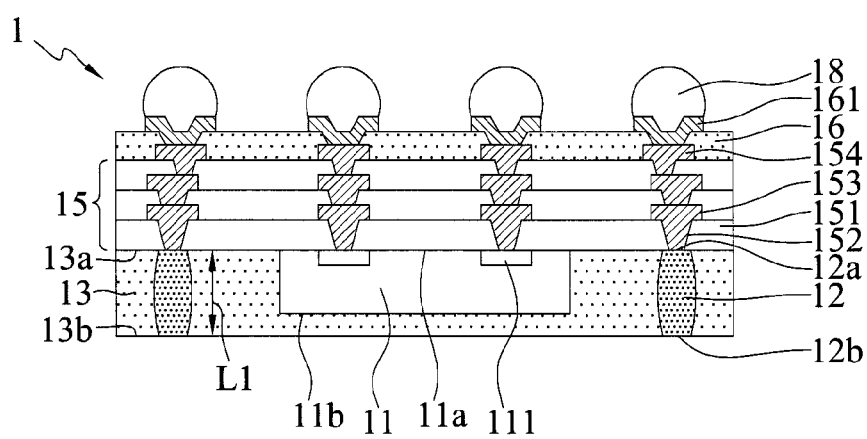

Since the length L4 of the portion of each of the conductive pillar 24' that is embedded in the encapsulant 26 is less than the length L3 of each of the conductive pillars 24', and the length L3 of the conductive pillar 24' may be equal to the length L1 of each of the conventional conductive balls 12 of FIG. 1G, the occurrence of damages to the conductive pillars according to the present invention may be prevented.

The dielectric layer 301 is formed on the first surface 21a of the base layer 21, the active surface 25a of the semiconductor element 25 and the adhesive layer 35, and the innermost conductive vias 302 are formed in the dielectric layer 301 and electrically connected with the seed layer 22 of the first terminals 24a of the conductive pillars 24'. The second wiring layer 303 is formed on the dielectric layer 301 and electrically connected with the conductive vias 302.

The semiconductor package 2' may comprise an adhesive layer 35 formed in the gap 351 between the semiconductor element 25 and the base layer 21, as shown in FIG. 3G or FIG. 3G'.

In summary, the semiconductor package and the method of fabricating the same according to the present invention are characterized by providing a base layer having a receiving part wherein a plurality of conductive pillars are formed on the base layer, or alternatively embedding a portion of each of the conductive pillars in the vias of the base layer, and accommodating the semiconductor element in the receiving part of the base layer, followed by forming an encapsulant to encapsulate the conductive pillars and the semiconductor element.

Accordingly, the present invention is suitable to be used in a semiconductor package having fine pitches conductive pillars. Moreover it has the advantage of reduced cost, as the semiconductor package does not require a third carrier in the fabricating process.

The length of each of the conductive pillars that is embedded in the encapsulant is relative short, thereby eliminating the occurrence of conductive pillars being damaged due to impact, pressing force exerted from the encapsulant.

In addition, the semiconductor element may be directly embedded in the receiving part of the base layer, which is then secured in position by the adhesive layer, to prevent displacement of the semiconductor element resulted from being pressed by the encapsulant.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
a base layer having opposing first and second surfaces, and a receiving part penetrating the first and second surfaces;
a plurality of conductive pillars disposed on the second surface of the base layer, each of the conductive pillars having opposing first and second terminals, with the second terminals being of a distant from the second surface of the base layer;
a semiconductor element received in the receiving part of the base layer and having an active surface being exposed from the first surface of the base layer and a passive surface opposing the active surface; and
an encapsulant formed on the second surface of the base layer, encapsulating the conductive pillars and the semiconductor element, and having opposing third and fourth surfaces,
wherein the second terminals of the conductive pillars are exposed from the fourth surface of the encapsulant.

2. The semiconductor package of claim 1, further comprising a first wiring layer formed on the fourth surface of the encapsulant, electrically connected to the second terminals of the conductive pillars, and having a plurality of first conductive pads.

3. The semiconductor package of claim 2, further comprising a first insulative protection layer formed on the fourth surface of the encapsulant, encapsulating the first wiring layer, and having a plurality of first openings, from which the first conductive pads are exposed.

4. The semiconductor package of claim 1, wherein the base layer further comprises a plurality of vias, from which the first terminals of the conductive pillars are exposed.

5. The semiconductor package of claim 1, further comprising a build-up structure disposed on the first surface of base layer and the active surface of the semiconductor element, electrically connected with the first terminals of the conductive pillars and solder pads of the semiconductor element, and having at least one dielectric layer, a plurality of conductive vias, and at least one second wiring layer having a plurality of second conductive pads.

6. The semiconductor package of claim 1, wherein the base layer has a plurality of vias penetrating the first surface and the second surface, a portion of the conductive pillars is received in the vias of the base layer, and the first terminals of the conductive pillars are exposed from the first surface of the base layer.

7. The semiconductor package of claim 1, further comprising an adhesive layer formed in a gap between the semiconductor element and the base layer.

8. A method, comprising:
providing a base layer having opposing first and second surfaces, and a receiving part penetrating the first and second surfaces;
forming on the second surface of the base layer a plurality of conductive pillars having opposing first and second terminals, with the second terminals being distant from the second surface of the base layer;
disposing in the receiving part of the base layer a semiconductor element having an active surface exposed from the first surface of the base layer and a passive surface opposing the active surface; and
forming on the second surface of the base layer an encapsulant having opposing third and fourth surfaces and encapsulating the conductive pillars and the semiconductor element,
wherein the second terminals of the conductive pillars are exposed from the fourth surface of the encapsulant.

9. The method of claim 8, further comprising, prior to forming the conductive pillars, the following steps of:
forming the base layer having the receiving part on a first carrier;
forming a resist layer having a plurality of through holes on the second surface of the base layer and a portion of the first carrier corresponding to the receiving part;
filling the through holes with a conductive material to form the conductive pillars on the second surface of the base layer; and
removing the resist layer to expose the conductive pillars.

10. The method of claim 8, further comprising, prior to forming the conductive pillars, the following steps of:
forming the base layer having the receiving part and a plurality of vias on a first carrier;
forming a resist layer having a plurality of through holes on the second surface of the base layer and a portion of the first carrier corresponding to the receiving part, the through holes corresponding to the vias;
filling the through holes and the vias with a conductive material to form the conductive pillars on the first carrier, wherein a portion of the conductive pillars is received in the vias of the base layer; and
removing the resist layer to expose another portion of the conductive pillars that is not received in the vias of the base layer.

11. The method of claim 10, further comprising forming a seed layer on the second surface of the base layer, a wall surface of the receiving part, a wall surface of the vias, and a portion of a first release layer formed on the first carrier.

12. The method of claim 8, further comprising thinning the encapsulant from the fourth surface to expose the second terminals of the conductive pillars.

13. The method of claim 8, further comprising forming on the fourth surface of the encapsulant a first wiring layer electrically connected to the second terminals of the conductive pillars and having a plurality of first conductive pads.

14. The method of claim 13, further comprising forming on the fourth surface of the encapsulant a first insulative protection layer encapsulating the first wiring layer and having a plurality of first openings, from which the first conductive pads are exposed.

15. The method of claim 14, further comprising disposing on the first insulative protection layer a second carrier having a second release layer encapsulating the first insulative protection layer and the first conductive pads that are exposed from the first openings.

16. The method of claim 14, further comprising disposing on the first insulative protection layer a semiconductor device that is electrically connected through a plurality of conductive elements with the first conductive pads that are exposed from the first openings.

17. The method of claim 16, further comprising forming in the base layer a plurality of vias, from which the first terminals of the conductive pillars are exposed.

18. The method of claim 8, further comprising forming on the first surface of the base layer and the active surface of the semiconductor element a build-up structure having at least one dielectric layer, a plurality of conductive vias, and at least one second wiring layer having a plurality of second conductive pads, and electrically connecting the build-up structure to the first terminals of the conductive pillars and solder pads of the semiconductor element.

19. The method of claim 8, wherein the base layer further has a plurality of vias penetrating the first surface and the second surface, a portion of the conductive pillars are received in the vias of the base layer, and the first terminals of the conductive pillars are exposed from the first surface of the base layer.

20. The method of claim 8, further comprising forming an adhesive layer in a gap between the semiconductor element and the base layer.

* * * * *